United States Patent

Ma et al.

[19]

[11] Patent Number: 6,075,741
[45] Date of Patent: *Jun. 13, 2000

[54] MULTIPLE STAGED POWER UP OF INTEGRATED CIRCUIT

[75] Inventors: Manny K.F. Ma; Troy A. Manning, both of Boise, Id.

[73] Assignee: Micron Technology, Inc., Boise, Id.

[*] Notice: This patent is subject to a terminal disclaimer.

[21] Appl. No.: 09/253,626

[22] Filed: Feb. 19, 1999

Related U.S. Application Data

[62] Division of application No. 08/908,234, Aug. 7, 1997, which is a continuation of application No. 08/675,007, Jul. 3, 1996, Pat. No. 5,781,490.

[51] Int. Cl.[7] .................................................. G11C 7/00
[52] U.S. Cl. ..................... 365/226; 365/194; 365/230.03
[58] Field of Search ................................... 365/226, 194, 365/233, 230.03, 149

[56] References Cited

U.S. PATENT DOCUMENTS

| | | | |
|---|---|---|---|
| 4,647,956 | 3/1987 | Shrivastava | 257/373 |
| 5,224,010 | 6/1993 | Tran | 361/90 |
| 5,408,144 | 4/1995 | Sakata et al. | 326/21 |
| 5,446,367 | 8/1995 | Pinney | 323/266 |
| 5,574,697 | 11/1996 | Manning | 365/226 |
| 5,615,162 | 3/1997 | Houston | 365/226 |
| 5,774,399 | 6/1998 | Kwon | 365/226 |
| 5,781,490 | 7/1998 | Ma et al. | 365/226 |
| 5,787,044 | 7/1998 | Duesman | 365/200 |

*Primary Examiner*—Son Mai
*Attorney, Agent, or Firm*—Schwegman, Lundberg, Woessner & Kluth, P.A.

[57] ABSTRACT

A complementary metal-oxide semiconductor (CMOS) integrated circuit, such as a dynamic random access memory (DRAM), is powered by supply voltage. The CMOS integrated circuit is divided into n circuit portions including a first circuit portion and a second circuit portion. Control circuitry generates a first powerup control signal. A first switch couples the supply voltage to the first circuit portion based on the first powerup control signal being active. The first powerup control signal is delayed by a selected time delay to produce a second powerup control signal. Alternatively, the second powerup control signal is generated independent of the first powerup control signal, but is active the selected time delay after the first powerup control signal is active. A second switch couples the supply voltage to the second circuit portion based on the second powerup control signal being active.

33 Claims, 3 Drawing Sheets

MULTIPLE STAGED POWER UP OF INTEGRATED CIRCUIT

This application is a divisional of U.S. Ser. No. 08/908,234, filed Aug. 7, 1997, which is a continuation of U.S. Ser. No. 08/675,007, filed Jul. 3, 1996, now U.S. Pat. No. 5,781,490, issued Jul. 14, 1998.

THE FIELD OF THE INVENTION

The present invention relates to semiconductor integrated circuits and, more particularly to reducing the susceptibility of complementary metal-oxide semiconductor (CMOS) integrated circuits, such as dynamic random access memories (DRAMs), to CMOS latchup during the initial application of power to the integrated circuit die.

BACKGROUND OF THE INVENTION

Complementary metal-oxide semiconductor (CMOS) integrated circuits are susceptible to CMOS latchup. CMOS latchup is an undesirable inherent phenomenon that creates a very low-resistance path between power supply rails in a CMOS integrated circuit, which causes large amounts of current to flow through the integrated circuit. The large amounts of current can prevent the CMOS integrated circuit from functioning properly and can even destroy the CMOS integrated circuit as a result of heat damage caused by high power dissipation. CMOS latchup is a well known and documented problem. See. e.g., Philip E. Allen and Douglas R. Holberg, *CMOS Analog Circuit Design* (Holt, Rinehart and Winston, Inc. 1987) and S. Wolf, *Silicon Processing for the VLSI Era,* Vol. 2: Process Integration (Lattice Press 1990).

This high current latchup state results from complementary parasitic bipolar junction transistor structures (npn and pnp transistor structures) formed during the fabrication of the complementary MOS devices in CMOS integrated circuits. The complementary bipolar junction transistor structures can interact electrically due to being close to one another, which cause the structures to exhibit characteristics similar to a pnpn diode having three p-n junctions. The "pnpn diodes" operate as reverse-bias junctions when there is no trigger current established. Nevertheless, sufficient trigger currents are established during a number of frequently occurring abnormal circuit operation conditions to produce a sufficient positive loop gain to cause the parasitic bipolar junction transistor structures to enter a regenerative positive feedback latchup state. The positive feedback loop is formed because the collector of the npn transistor structure drives the base of the pnp transistor structure and the collector of the pnp transistor structure drives the base of the npn transistor structure. In the regenerative positive feedback latchup state, the loop gain ($\beta_{npn}\beta_{pnp}$) exceeds unity. The regenerative positive feedback latchup state is manifested by a large amount of current drawn from the power supply through the "pnpn" structure. This large amount of current can significantly reduce or collapse the power supply voltage.

In order to recover from the high current latchup state, typically power must be removed from the integrated circuit (he, thereby breaking the regenerative loop. Even if the integrated circuit die is restored to normal operation after excitation into the latchup state, the high latchup currents can cause significant reliability problems in the exposed integrated circuit die. Thus, CMOS latchup must be avoided in order to ensure the reliability of the integrated circuit die. Many approaches have been used to control, or to substantially eliminate CMOS latchup, such as with processing techniques and circuit layout procedures. Nevertheless, the ever decreasing CMOS integrated circuit dimensions has significantly heightened the severity of the latchup problem. Therefore, new CMOS latchup suppression techniques are needed to keep pace with the shrinking integrated circuit dimensions.

Memory integrated circuits, such as dynamic random access memories (DRAMs), are particularly prone to CMOS latchup when power is initially applied to the memory integrated circuit. This is especially true of large DRAMs, such as 256 Mbit and higher, which have significantly decreased dimensions between the parasitic bipolar junction transistor structures. In addition, these larger capacity DRAMs comprise memory arrays which have a very large capacitance relative to the substrate of the DRAM. This large capacitance can cause the substrate to couple up towards the regulated supply voltage (Vcc). The resulting increase in the substrate voltage (Vbb) can cause Vbb to increase to the point where certain of the "pnpn" parasitic diode junctions become forward biased and turn on the "pnpn" parasitic diodes to thereby trigger the regenerative positive feedback latchup state. The "pnpn" parasitic diode typically turns on in DRAMs with a base-emitter turn on voltage of approximately 0.7 volts. Therefore, there is a need for techniques to suppress CMOS latchup during power up of DRAMs and other such memory integrated circuits.

SUMMARY OF THE INVENTION

The present invention provides a method and apparatus for powering up a complementary metal-oxide semiconductor (CMOS) integrated circuit A supply voltage is provided to the CMOS integrated circuit. The CMOS integrated circuit is divided into n circuit portions including a first circuit portion and a second circuit portion. Control circuitry generates a first powerup control sibyl A first switch couples the supply voltage to the first circuit portion based on the first powerup control signal being active. A second powerup control signal is generated which is active a selected time delay after the first powerup control signal is active. A second switch couples the supply voltage to the second circuit portion based on the second powerup control signal being active.

In one embodiment of the present invention, the second powerup control signal is generated by delaying the first powerup control signal by the selected time delay to produce the second powerup control sign. In an alternative embodiment of the present invention, the second powerup control signal is generated independent of the first powerup control signal.

In one embodiment of the present invention, a substrate voltage (Vbb) of the CMOS integrated circuit is supplied by a Vbb voltage pump circuit. In this embodiment, the selected time delay represents a sufficient time for the Vbb voltage pump circuit to recover from the application of the supply voltage to the first circuit portion to substantially prevent CMOS latchup in the CMOS integrated circuit during the power up of the CMOS integrated circuit. In addition, the CMOS integrated circuit is divided into a sufficient number of circuit portions so that a capacitance, relative to the substrate of the CMOS integrated circuit, contained in any one of the n circuit portions is sufficiently low to substantially prevent the substrate voltage from coupling up towards the supply voltage to a point which could trigger CMOS latchup in the CMOS integrated circuit during the power up of each of the n circuit portions.

In one embodiment of the present invention, the CMOS integrated circuit is embodied in a memory integrated circuit, such as a dynamic random access memory (D)RAM). In this embodiment, the CMOS memory integrated circuit is divided into n memory array portions. Each of the n memory array portions have memory cells organized in rows and columns for storing data.

The method and apparatus of the present invention can be employed to substantially suppresses CMOS latchup during the power up of large capacity memory integrated circuits, such as 256 Mbit or larger DRAMs, by providing a staged power up to each of the memory array portions of the memory integrated circuit. With the present invention, the substrate voltage (Vbb) is never coupled up to the critical point to trigger a regenerative positive feedback CMOS latchup state because no "pnpn" parasitic diodes turn on as a result of the base-emitter voltage level of the "pnpn" parasitic diodes being kept sufficiently below their turn-on voltage.

DESCRIPTION OF THE PREFERRED EMBODIMENTS

Figure 1:
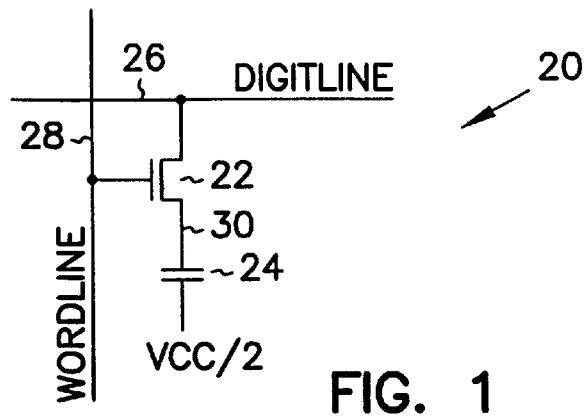
FIG. 1 is a schematic diagram of a one transistor/one capacitor DRAM memory cell.

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

As discussed in the background section, complementary metal-oxide semiconductor (CMOS) integrated circuits are susceptible to CMOS latchup when power is initially applied to the CMOS integrated circuit. CMOS memory integrated circuits, such as CMOS dynamic random access memories (DRAMs), are particularly prone to CMOS latchup during the power up of the memory integrated circuit. The present invention, as described in detail below, is specifically embodied in a CMOS DRAM, such as DRAMs commercially available from Micron Technology, Inc. of Boise, Id., to reduce CMOS latchup during the power up of the DRAM. The present invention, however, is alternatively embodied in any suitable CMOS memory integrated circuit or other CMOS inter circuit, to reduce CMOS latchup during power up of the memory or other integrated circuit A DRAM memory cell or memory bit is schematically illustrated generally at 20 in FIG. 1. Memory cell 20 comprises a transistor 22 and a capacitor 24. Memory cell 20 is capable of holding binary information in the form of stored charge on capacitor 24. Transistor 22 operates as a switch coupled between capacitor 24 and a digit line 26. Capacitor 24 includes a common node which is biased at approximately Vcc/2 or at the cell plate voltage. The gate which controls the switching action of transistor 22 is coupled to a word line 28. A logic 1 binary value is stored in memory cell 20 by having a plus Vcc/2 charge across capacitor 24. A logic 0 binary value is stored in memory cell 20 by having minus Vcc/2 charge across capacitor 24. Thus, a node 30, representing the connection between transistor 22 and capacitor 24, is at a potential equal to Vcc when a logic 1 value is stored in memory array 20 and is at a zero or a ground level potential when a logic 0 value is stored in memory cell 20.

Figure 2:
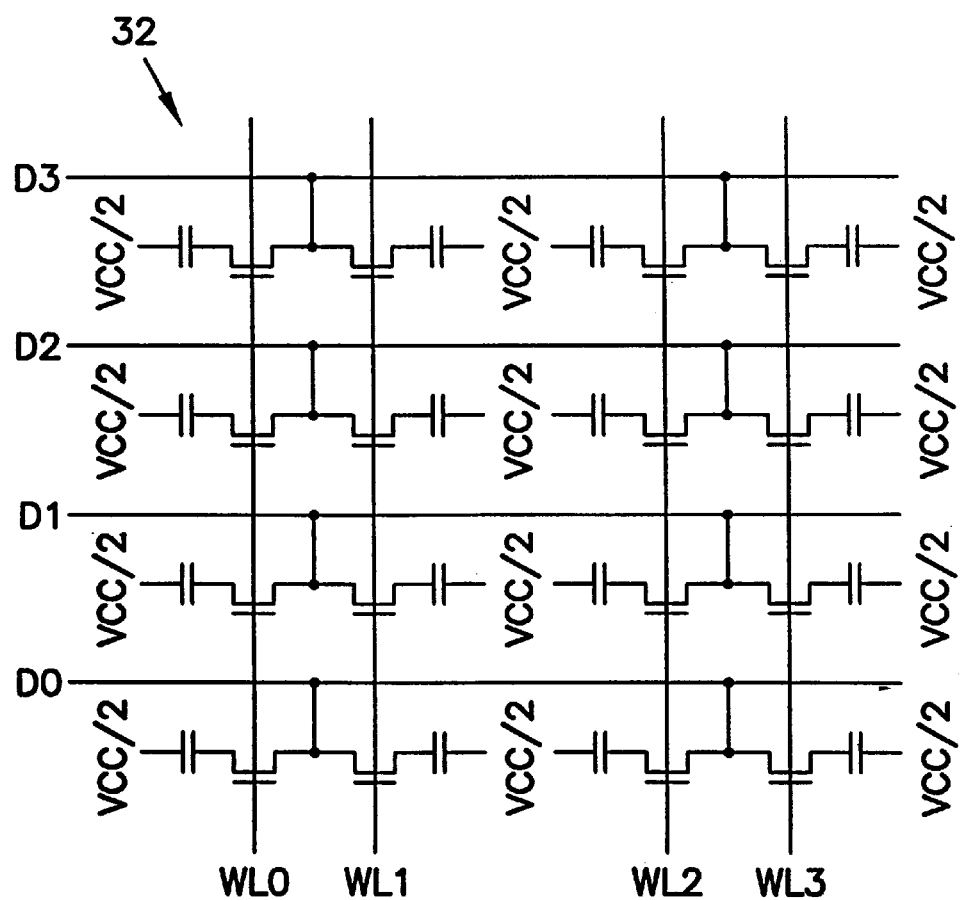
FIG. 2 is a schematic diagram of a simplified memory array structure formed from DRAM memory cells such as illustrated in FIG. 1.

Memory arrays in DRAMs are formed by tiling a number of memory cells, such as memory cell 20, together such as schematically illustrated in FIG. 2. In FIG. 2, a simplified memory array structure is generally illustrated at 32. In memory array structure 32, the memory cells along a given digit line (D0, D1, D2, or D3) do not share a common word line (WL0, WL1, WL2, or WL3) and memory cells along a common word line do not share a common digit line. The simplified diagram of memory array structure 32 in FIG. 2 is for illustrative purposes only to show how the one transistor/one capacitor memory cells are employed in an array structure which is easily scaled. Although the design of the DRAM memory cells and memory arrays may appear simple, their actual design and implementation are highly complex.

DRAMs require a variety of internally generated voltages to operate and to optimize performance of the DRAM. For example, these internally generated voltages typically include a boosted word line voltage (Vccp), an internally regulated supply voltage (Vcc), a cell plate voltage (Vcc/2), a digit line bias voltage (DVC2), and a pumped substrate voltage (Vbb). Each of the internally generated voltages is regulated with a different type of voltage generator, for example, a line voltage converter is used to generate Vcc, a modified CMOS inverter generates DVC2, and voltage pump circuits generate Vccp and Vbb.

One method currently used to substantially reduce one type of excitation condition that could trigger CMOS latchup during the operation of a DRAM is to utilize exclusively PMOS transistors in the Vbb voltage pump circuit Various active nodes tend to swing negative with respect to Vbb. Any n-diffusion regions connected to these active nodes forward bias to possibly trigger latchup and current injection into memory cell arrays.

As is known by one skilled in the art of semiconductor integrated circuits design, and as readily ascertained from FIGS. 1 and 2, the capacitance relative to the substrate of a DRAM memory array is very large when the DRAM comprises numerous memory cells formed into one or more memory arrays. For example, a 16 Mbit DRAM memory array typically has approximately 200 nF capacitance relative to the substrate resulting from the memory cells. DRAMs of 256 Mbit and higher have such massive capacitances relative to the substrate of the DRAM that the capacitance can cause the substrate to couple up towards Vcc during the power up of the DRAM. The coupling up of the substrate results from the great voltage swing in the memory cell capacitors during the charging of the memory array cell capacitors during the power up of the DRAM. As Vbb increases, with the additional coupling up effect of the added capacitance of the larger memory arrays, Vbb can increase to a level which forward biases "pnpn" parasite diode junctions in the DRAM to thereby turn on the corresponding "pnpn" parasitic diodes to trigger a regenerative positive feedback latchup state.

Figure 3:
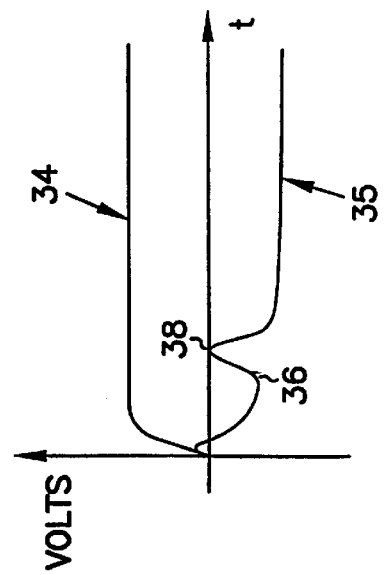
FIG. 3 is a timing diagram illustrating an undesirable increase in the substrate voltage (Vbb) during the power up of a large CMOS DRAM due to the coupling effect of the capacitance of the memory cells of the DRAM.

The undesirable increase in the Vbb substrate voltage during the power up phase of a large CMOS DRAM, such as a 256 Mbit DRAM, due to the coupling up effect of the massive capacitance of the memory cells of the DRAM is illustrated in timing diagram form in FIG. 3. FIG. 3 illustrates the voltage value of Vcc on a line 34 and the voltage value of Vbb on a line 35 verses time as the DRAM is powered up. As illustrated in FIG. 3, as the DRAM is powered up Vcc increases, and the Vbb voltage pump circuit accordingly brings the substrate voltage Vbb down towards its desired voltage level. Nevertheless, at a point indicated at 36, the coupling up of the substrate causes Vbb to suddenly begin to increase. At a point indicated at 38, Vbb is brought so high that a regenerative positive feedback latchup state is triggered. In 256 Mbit DRAMs and higher, the "pnpn" parasitic diode typically turns on with a base emitter turn-on voltage of approximately 0.7 volts. In effect, the Vbb voltage pump circuit in these large DRAMs is not able to compensate quickly enough to this coupling up effect resulting from the massive of the memory cells in the large DRAMs. Although it may be possible to build a more robust Vbb voltage pump circuit, the power up stage is by far the worst case scenario for stressing the Vbb voltage pump circuit.

Figure 4:
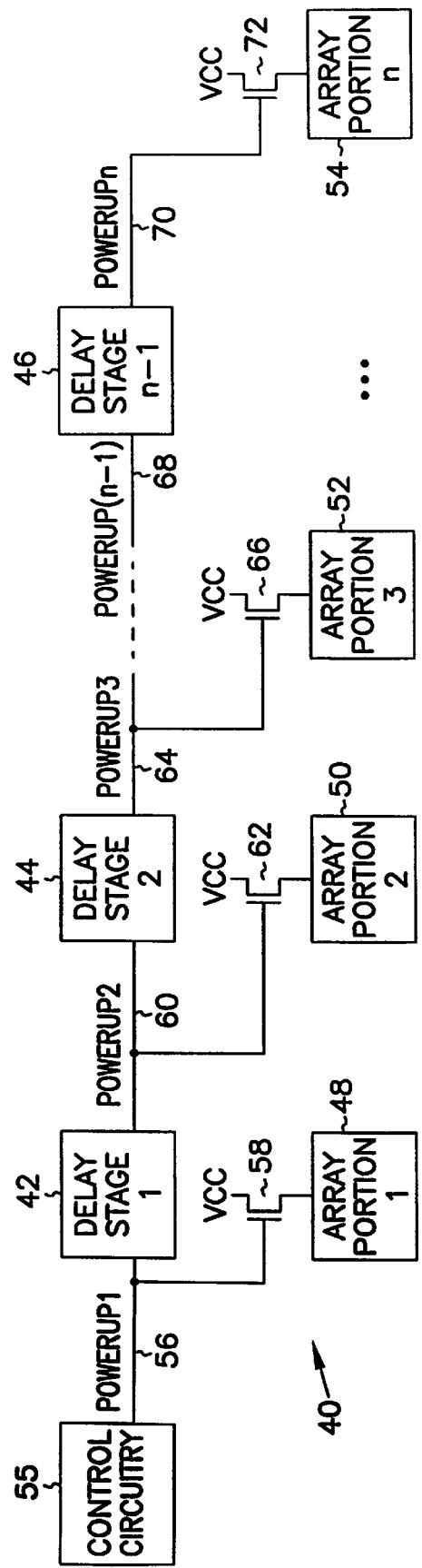
FIG. 4 is a schematic diagram of a preferred embodiment of a staged delay circuit according to the present invention.

A preferred embodiment of a staged delay circuit according to the present invention is illustrated generally at 40 in FIG. 4. Staged delay circuit 40 comprises n-1 delay stages (delay stages 1, 2, . . . , n-1), such as indicated respectively at 42, 44, and 46. The n-1 delay stages are coupled between n memory array portions (array portion 1, array portion 2, array portion 3, . . . , array portion n), such as indicated respectively at 48, 50, 52, and 54. DRAMs-and other memory integrated circuits must be powered up and initialized in a predefined manner to ensure proper operation of the memory integrated circuit. During the power up phase, certain external and internal control signals, such as a POWERUP signal are employed for controlling various circuitry and power buses in the DRAM to facilitate the proper powering up of the memory integrated circuit. As illustrated in FIG. 4, control circuitry 55 generates a POWERUP1 signal, or similar control signal, during the power up phase of the DRAM. The POWERUP1 signal is initially provided on a line 56 to the gate of a transistor switch 58. Transistor switch 58 couples the Vcc power line to array portion 48 when the POWERUP1 signal is active to turn on transistor switch 58. Thus, the POWERUP1 signal on line 56 initiates the power up of first array portion 48 and the corresponding charging of its memory cell capacitors to the Vcc/2 voltage level.

The POWERUP1 signal on line 56 is also provided to delay stage 42 which delays the POWERUP1 signal to provide a POWERUP2 signal on a line 60 to the gate of a transistor switch 62. Transistor switch 62 couples the Vcc power line to second array portion 50 when the POWERUP2 signal is active to turn on transistor switch 62. Thus, the POWERUP2 signal on line 60 initiates, after one stage delay, the power up of array portion 50 and the corresponding charging of its memory cell capacitors to the Vcc/2 voltage level. Similarly, the POWERUP2 signal on line 60 is also provided to delay stage 44 which delays the POWERUP2 signal to provide a POWERUP3 signal on a line 64 to the gate of a transistor switch 66. Transistor switch 66 couples the Vcc power line to third array portion 52 when the POWERUP3 signal is active to turn on transistor switch 66. Thus, the POWERUP3 signal on line 64 initiates, after two stage delays, the power up of array portion 52 and the corresponding charging of its memory cell capacitors to the Vcc/2 voltage level.

In this fashion, the POWERUP1, or other control signal, is delayed through n-2 delay stages similar to delay stages 42 and 44 until a POWERUP(n-1) signal, representing the POWERUP1 signal delayed by n-2 delay stages, is provided on a line 68 to delay stage 46, representing the $(n-1)^{th}$ delay stage. Delay stage 46 delays the POWERUP(n-1) signal to provide a POWERUPn signal on a line 70 to the gate of a transistor switch 72. Transistor switch 72 couples the Vcc power line to $n^{th}$ array portion 54 of the DRAM, when the POWERUPn signal is active to turn on transistor switch 72. Thus, the POWERUPn signal on line 70 initiates, after n-1 stage delays, the power up of array portion 54 and the corresponding charging of its memory cell capacitors to the Vcc/2 voltage level.

The delay produced by each delay stage, such as delay stages 42, 44, and 46 of staged delay circuit 40, must be sufficient to allow the Vbb voltage pump (not shown) circuit to sufficiently recover and thereby bring the substrate voltage Vbb away from the power supply Vcc voltage. A sufficient RC network delay in one embodiment of a 256 Mbit DRAM according to the present invention is approximately 10 microseconds which permits the Vbb voltage pump circuit to recover and sufficiently decrease the substrate voltage Vbb.

By only powering one memory array at a time, the large capacitance of the total DRAM is effectively reduced for each stage of the power up from a total capacitance of "C" to a staged capacitance of "C/n". For example, in one embodiment of a 256 Mbit DRAM according to the present invention, the 256 Mbits of DRAM memory cells are divided into four array portions of 16 Mbits separated by three delay stages. In this 256 Mbit DRAM embodiment, each array portion of 16 Mbits of DRAM memory cells comprises approximately 200 nF capacitance relative to the substrate, which is typically a sufficiently low enough capacitance value to prevent CMOS latchup from occurring during the staged power up of each array portion of the 256 Mbit DRAM.

Figure 5:
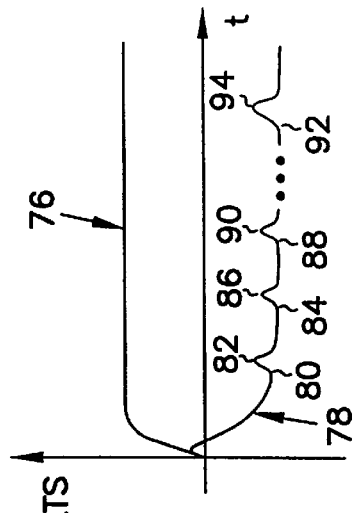
FIG. 5 is a timing diagram illustrating the operation of the staged delay circuit of FIG. 4 in reducing the coupling effect of the capacitance of the memory cells of a large, MOS DRAM or other memory integrated circuit to prevent CMOS latchup during the power up of the DRAM

The operation of a 256 Mbit DRAM or other memory integrated circuit according to the present invention, which employs the staged delay circuit of FIG. 4 to reduce the coupling effect of the capacitance of the memory cells of the DRAM to prevent CMOS latchup during the power up of the DRAM, is illustrated in timing diagram form in FIG. 5. FIG. 5 illustrates the voltage value of Vcc on a line 76 and the voltage value of Vbb on a line 78 verses time as the DRAM is powered up. As illustrated in FIG. 5, as the DRAM is powered up Vcc increases, and the Vbb voltage pump circuit accordingly brings the substrate voltage Vbb down towards its desired voltage level. As illustrated in FIG. 4, the DRAM memory array or arrays is divided into n array portions. The number of array portions n is dictated by the total capacitance of the memory cells of the DRAM. As illustrated in FIG. 5, when the power up sequence is initiated, the first POWERUP1 signal initiates the power up of the first array portion 48 and Vbb is coupled towards Vcc, such as represented beginning at a point indicated at 80. This coupling up of the substrate causes Vbb to suddenly begin to increase up to a point indicated at 82, which is not high enough to trigger a regenerative positive feedback latchup state.

After a sufficient recovery time, the Vbb voltage pump circuit brings the Vbb substrate voltage back down towards its desired level and the one-staged delayed POWERUP2 signal initiates the power up of the second memory array portion 50. Accordingly, beginning at a point indicated at 84, Vbb is again coupled towards Vcc. This coupling up of the substrate causes Vbb to suddenly begin to increase up to a point indicated at 86, which is not high enough to trigger a regenerative positive feedback latchup state. Again, the coupling of the substrate never reaches the critical point where latchup could occur, or in other words, no "pnpn" parasitic diodes turn on because the base-emitter voltage level is kept sufficiently below the approximately 0.7 volts turn-on voltage.

Similarly, after a sufficient recovery time, the Vbb voltage pump circuit again brings the Vbb substrate voltage back down towards its desired level and the two-staged delayed POWERUP3 signal initiates the power up of the third memory array portion 52. Accordingly, beginning at a point indicated at 88, Vbb is again coupled towards Vcc. This coupling up of the substrate causes Vbb to suddenly begin to increase up to a point indicated at 90, which is not high enough to trigger a regenerative positive feedback latchup state.

In this fashion, the Vbb voltage pump circuit keeps bringing the Vbb substrate voltage back down towards its desired level after each array portion is powered up. After, n−1 delay stages, the (n−1)-staged delayed POWERUPn signal initiates the power up of the $n^{th}$ memory array portion 54. Accordingly, beginning at a point indicated at 92, Vbb is again coupled towards Vcc. This coupling up of the substrate causes Vbb to suddenly begin to increase up to a point indicated at 94, which is not high enough to trigger a regenerative positive feedback latchup state.

As illustrated, the power up of the DRAM according to the present invention is divided into as many stages as necessary to prevent latchup from occurring. In effect the Vbb voltage pump circuit in the large DRAM according to the present invention is able to compensate quickly enough to the coupling up effect of the capacitance of the memory cells in the given array portion of the large DRAM to effectively prevent CMOS latchup from occurring during the power up of the DRAM.

Thus, the method and apparatus according to the present invention provide a technique to substantially suppress CMOS latchup during power up of a larger capacity DRAM or other memory integrated circuit. In fact, this staged power up technique of the present invention, which divides a total capacitance of a given portion of an integrated circuit into n sub-portions, can be embodied in any CMOS integrated circuit where the total capacitance of the given portion causes the substrate voltage to couple up towards the power supply voltage during the power up of the integrated circuit. As discussed in the background section, CMOS latchup must be avoided in order to ensure the reliability of the integrated circuit die and to possibly prevent the destruction of the CMOS integrated circuit.

Figure 6:
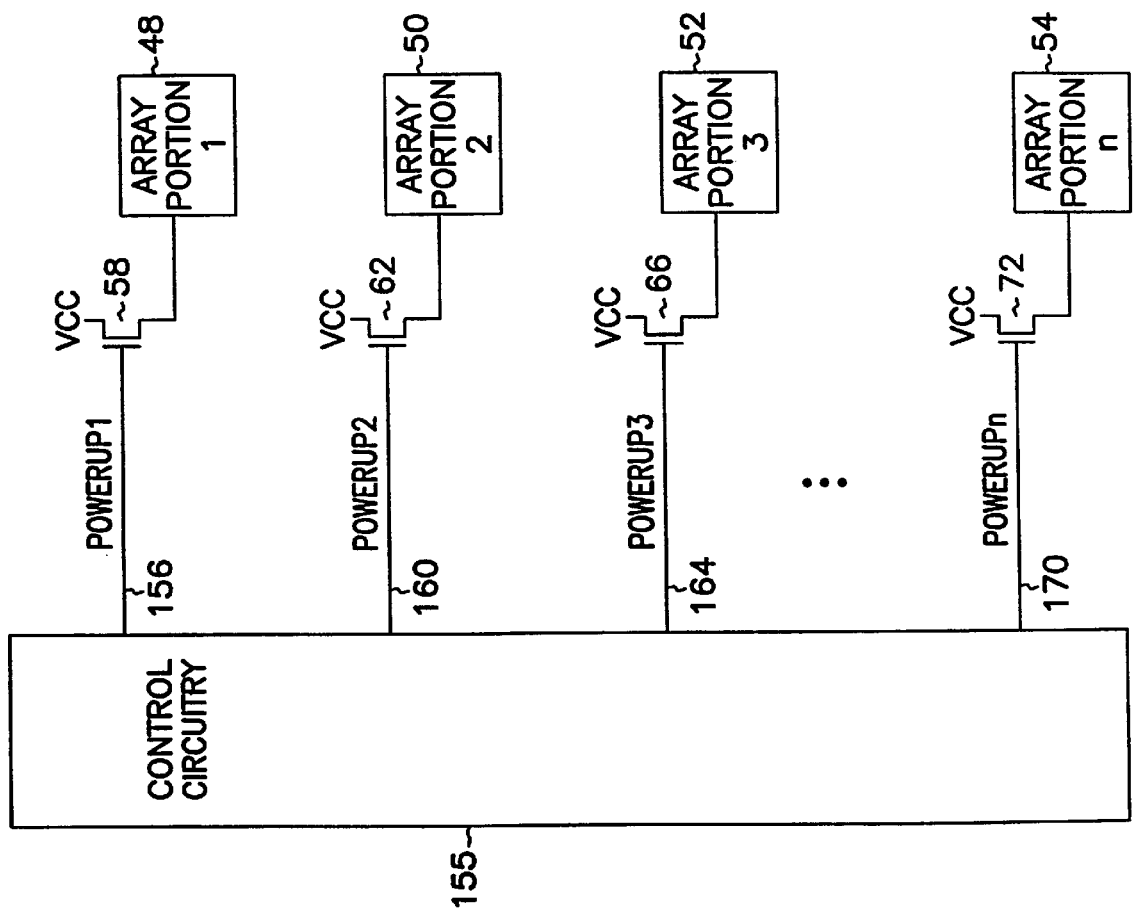
FIG. 6 is a schematic diagram of an alternate embodiment of a staged power up circuit according to the present invention.

The staged delay circuit 40 illustrated in FIG. 4 is only one implementation of the staged power up technique of the present invention. For example, an alternate embodiment of the present invention for generating the POWERUP1, POWERUP2, POWERUP3, . . . , POWERUPn signals is illustrated in FIG. 6. As illustrated in FIG. 6, control circuitry 155 generates the POWERUP1 signal or similar control signal, during the power up phase of the DRAM. The POWERUP1 signal is initially provided on a line 156 to the gate of transistor switch 58. Transistor switch 58 couples the Vcc power line to array portion 48 when the POWERUP1 signal is active to turn on transistor switch 58. Thus, the POWERUP1 signal on line 156 initiates the power up of first array portion 48 and the corresponding charging of its memory cell capacitors to the Vcc2 voltage level.

Control circuitry 155 also generates a POWERUP2 signal on a line 160 to the gate of a transistor switch 62. The POWERUP2 signal is generated independent of the POWERUP1 signal, but is active one selected time delay after the POWERUP1 signal is active. Transistor switch 62 couples the Vcc power line to second array portion 50 when the POWERUP2 signal is active to turn on transistor switch 62. Thus, the POWERUP2 signal on line 160 initiates, after one selected time delay, the power up of array portion 50 and the corresponding charging of its memory cell capacitors to the Vcc/2 voltage level.

Similarly, control circuitry 155 also generates a POWERUP3 signal on a line 164 to the gate of a transistor switch 66. The POWERUP3 signal is generated independent of the POWERUP1 signal, but is active two selected time delays after the POWERUP1 signal is active. Transistor switch 66 couples the Vcc power line to third array portion 52 when the POWERUP3 signal is active to turn on transistor switch 66. Thus, the POWERUP3 signal on line 164 initiates, after two selected time delays, the power up of array portion 52 and the corresponding charging of its memory cell capacitors to the Vcc/2 voltage level.

In like fashion, control circuitry 155 generates the additional delayed POWERUP control signals in parallel, and generates a POWERUPn signal on a line 170 to the gate of a transistor switch 72. The POWERUPn signal is generated independent of the POWERUP1 signal, but is active n−1 selected time delays after the POWERUP1 signal is active. Transistor switch 72 couples the Vcc power line to $n^{th}$ array portion 54 of the DRAM, when the POWERUPn signal is active to turn on transistor switch 72. Thus, the POWERUPn signal on line 170 initiates, after n−1 selected time delays, the power up of array portion 54 and the corresponding charging of its memory cell capacitors to the Vcc/2 voltage level.

As with the stage delays of the embodiment of the invention illustrated in FIG. 4, in the alternate embodiment of the present invention illustrated in FIG. 6 each of the selected time delays must be sufficient to allow the Vbb voltage pump (not shown) circuit to sufficiently recover and thereby bring the substrate voltage Vbb away from the power supply Vcc voltage.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the electrical, computer, and telecommunications arts will readily appreciate that the present invention may be implemented in a very wide variety of embodiments. This application is intended to cover any adaptations or variations of the preferred embodiment discussed herein. Therefore, it is manifestly intended that this invention be limited only by the claims and the equivalents thereof.

What is claimed is:

1. A complementary metal-oxide semiconductor (CMOS) memory integrated circuit being powered by a supply voltage comprising:

n memory array portions including a first memory array portion and a second memory portion, each memory array portion having memory cell capacitors organized in rows and columns for storing data;

control circuitry generating a first powerup control signal when the supply voltage is first applied to the CMOS memory integrated circuit, and further generating a second powerup control signal which is active a selected time delay after the first powerup control signal is active;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

2. The CMOS memory integrated circuit of claim 1 wherein the control circuitry includes:

a first delay stage for delaying the first powerup control signal by the selected time delay to produce the second powerup control signal.

3. The CMOS memory integrated circuit of claim 1 wherein the control circuitry generates the second powerup control signal independent of the first powerup control signal.

4. The CMOS memory integrated circuit of claim 1 wherein the CMOS memory integrated circuit is a dynamic random access memory (DRAM).

5. The CMOS memory integrated circuit of claim 1 wherein a substrate voltage (Vbb) of the CMOS memory integrated circuit is supplied by a Vbb voltage pump circuit, and wherein the selected time delay represents a sufficient time for the Vbb voltage pump circuit to recover from the application of the supply voltage to the first memory array portion to substantially prevent CMOS latchup in the CMOS memory integrated circuit during the power up of the CMOS memory integrated circuit.

6. The CMOS memory integrated circuit of claim 1 wherein a capacitance, relative to a substrate of the CMOS memory integrated circuit, of all of the memory cell capacitors of any one of the n memory array portions is sufficiently low to substantially prevent a substrate voltage from coupling up towards the supply voltage to a point which could trigger CMOS latchup in the CMOS memory integrated circuit during the power up of each of the n memory array portions.

7. The CMOS memory integrated circuit of claim 1 wherein the n memory array portions comprise at least approximately 256 Mbits of memory cell capacitors.

8. A complementary metal-oxide semiconductor (CMOS) memory integrated circuit powered by a voltage supply, the circuit comprising:

n memory array portions, each memory array portion having a plurality of memory cell capacitors for storing data;

control circuitry generating a staged sequence of n memory array powerup control signals upon commencement of powerup of the CMOS memory integrated circuit, each of the n memory array powerup signals being separated from the other by at least a predetermined time delay interval; and n switches, each of which is responsive to a corresponding one of the n control signals for coupling the voltage supply to the memory array portion corresponding to that switch when the corresponding memory array powerup signal is active for causing each memory array portion to be activated separate from other memory array portions.

9. The CMOS memory integrated circuit of claim 8 wherein the control circuitry also comprises at least n−1 delay stages having at least a selected time delay for staging each of the n powerup control signals from the other by at least the selected time delay.

10. The CMOS memory integrated circuit of claim 9 wherein the control circuitry separates the each of n powerup control signals by a predetermined time interval sufficient to allow transient load effects on the voltage supply from a memory array portion to be eliminated before the voltage supply is connected to the next memory array portion.

11. The CMOS memory integrated circuit of claim 8 wherein the CMOS memory integrated circuit is a dynamic random access memory (DRAM).

12. The CMOS memory integrated circuit of claim 8 wherein a substrate voltage (Vbb) of the CMOS memory integrated circuit is supplied by a Vbb voltage pump circuit, and wherein the selected time interval between each of the n control signals represents a sufficient time for the Vbb voltage pump circuit to recover from the application of the supply voltage to the preceding memory array portion thereby substantially preventing CMOS latchup in the CMOS memory integrated circuit during the power up of the CMOS memory integrated circuit.

13. The CMOS memory integrated circuit of claim 8 wherein the array portion capacitance, relative to a substrate of the CMOS memory integrated circuit, of the memory cell capacitors of each of the n memory array portions is sufficiently low to substantially prevent a substrate voltage from coupling up towards the voltage of the voltage supply to a point which could trigger CMOS latchup in the CMOS memory integrated circuit during the power up of any of the n memory array portions.

14. The CMOS memory integrated circuit of claim 8 wherein the n memory array portions comprise at least approximately 256 Mbits of memory cell capacitors.

15. A complementary metal-oxide semiconductor (CMOS) memory integrated circuit powered by a supply voltage, the circuit comprising:

n memory array portions including a first memory array portion and n−1 additional memory array portions, each memory array portion including a capacitor bank having plurality of memory cell capacitors for storing data;

control circuitry for generating an initial powerup control signal when the supply voltage is first applied to the CMOS memory integrated circuit, and for generating n−1 further powerup control signals, each of which becomes active following a selected time delay from the preceding powerup control signal becoming active;

a first switch responsive to a first powerup control signal to couple the supply voltage to the first memory array portion when the first powerup control signal is active to cause the first memory array portion to be activated; and a plurality of n−1 additional switches, each of which is responsive to one of the further powerup control signals for coupling the supply voltage to each of the n memory array portions when its corresponding powerup control signal becomes active, causing each of the n−1 memory array portions to be activated in a staged manner.

16. The CMOS memory integrated circuit of claim 15 wherein the control circuitry includes n–1 delay stages for delaying each of the powerup control signals by at least the selected time delay from the powerup control signal immediately preceding it.

17. The CMOS memory integrated circuit of claim 15 wherein the control circuitry includes a single delay stage for delaying each powerup control signal by the selected time delay from the powerup control signal immediately preceding it.

18. The CMOS memory circuit of claim 15 wherein the CMOS memory integrated circuit is a dynamic random access memory (DRAM).

19. The CMOS memory integrated circuit of claim 15 wherein a substrate voltage (Vbb) of the CMOS memory integrated circuit is supplied by a Vbb voltage pump circuit, and wherein the selected time delay represents a sufficient time for the Vbb voltage pump circuit to recover from the application of supply voltage to each of the memory array portions to substantially prevent CMOS latchup in the CMOS memory integrated circuit during the powerup of the CMOS memory integrated circuit.

20. The CMOS memory integrated circuit of claim 15 wherein a capacitance, relative to the substrate of the CMOS memory integrated circuit, of the bank of the memory cell capacitors of any one of the n memory array portions is sufficiently low so as to substantially prevent a substrate voltage from coupling up towards the supply voltage to a point which could trigger CMOS latchup in the CMOS memory integrated circuit during the powerup of each of the n memory array portions.

21. The CMOS memory integrated circuit of claim 15 wherein the n memory array portions comprise at least 256 Mbits of memory cell capacitors.

22. A complementary metal-oxide semiconductor (CMOS) memory integrated circuit being powered by a supply voltage comprising:

n memory array portions including a first memory array portion and a second memory portion, each memory array portion having memory cell capacitors organized in rows and columns for storing data;

control circuitry generating a first powerup control signal when the supply voltage is first applied to the CMOS memory integrated circuit, and a first delay stage for delaying the first powerup control signal by the selected time delay to produce the second powerup control signal which is active a selected time delay after the first powerup control signal is active;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

23. A complementary metal-oxide semiconductor (CMOS) memory integrated circuit being powered by a supply voltage comprising:

n memory array portions including a first memory array portion and a second memory portion, each memory array portion having memory cell capacitors organized in rows and columns for storing data;

control circuitry generating a first powerup control signal when the supply voltage is first applied to the CMOS memory integrated circuit, and further generating a second powerup control signal which is independent of the first powerup control signal;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

24. A complementary metal-oxide semiconductor (CMOS) memory integrated circuit being powered by a supply voltage comprising:

a voltage pump circuit for supplying a substrate voltage (Vbb) of the CMOS memory integrated circuit;

n memory array portions including a first memory array portion and a second memory portion, each memory array portion having memory cell capacitors organized in rows and columns for storing data;

control circuitry generating a first powerup control signal when the supply voltage is first applied to the CMOS memory integrated circuit, and includes a first delay stage for delaying the first powerup control signal by a selected time delay to produce a second powerup control signal which is active a selected time delay after the first powerup control signal is active, the selected time delay representing a sufficient time for the Vbb voltage pump circuit to recover from the application of the supply voltage to the first memory array portion to substantially prevent CMOS latchup in the CMOS memory integrated circuit during the powerup of the CMOS memory integrated circuit;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

25. A complementary metal-oxide semiconductor (CMOS) memory integrated circuit being powered by a supply voltage comprising:

a voltage pump circuit for supplying a substrate voltage (Vbb) of the CMOS memory integrated circuit;

n memory array portions including a first memory array portion and a second memory portion, each memory array portion having memory cell capacitors organized in rows and columns for storing data;

control circuitry generating a first powerup control signal when the supply voltage is first applied to the CMOS memory integrated circuit, and further generating a second powerup control signal which is active a selected time delay after the first powerup control signal is active, the selected time delay representing a sufficient time for the Vbb voltage pump circuit to recover from the application of the supply voltage to the first memory array portion to substantially prevent CMOS latchup in the CMOS memory integrated circuit during the powerup of the CMOS memory integrated circuit;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

26. A complementary metal-oxide semiconductor (CMOS) memory integrated circuit being powered by a supply voltage comprising:

n memory array portions including a first memory array portion and a second memory portion, each memory array portion having memory cell capacitors organized in rows and columns for storing data and the total capacitance relative to a substrate of the CMOS memory integrated circuit of all of the memory cell capacitors of any one of the n memory array portions is sufficiently low to substantially prevent a substrate voltage from coupling up towards the supply voltage to a point which could trigger CMOS latchup in the CMOS memory integrated circuit during the power up of each of the n memory array portions;

control circuitry generating a first powerup control signal when the supply voltage is first applied to the CMOS memory integrated circuit, and further generating a second powerup control signal which is active a selected time delay after the first powerup control signal is active;

a first switch responsive to the first powerup control signal to couple the supply voltage to the first memory array portion when the first powerup control signal is active to cause the first memory array portion to be activated; and a second switch responsive to the second powerup control signal to couple the supply voltage to the second memory array portion when the second powerup control signal is active to cause the second memory array portion to be activated.

27. A complementary metal-oxide semiconductor (CMOS) memory integrated circuit powered by a voltage supply, the circuit comprising:

n memory array portions, each memory array portion having a plurality of memory cell capacitors for storing data;

control circuitry generating a staged sequence of n memory array powerup control signals upon commencement of powerup of the CMOS memory integrated circuit, each of the n memory array powerup signals being separated from the other by at least a predetermined time delay interval; and n switches, each of which is responsive to a corresponding one of the n control signals for coupling the voltage supply to the memory array portion corresponding to that switch when the corresponding memory array powerup signal is active for causing each memory array portion to be activated separate from other memory array portions.

28. A complementary metal-oxide semiconductor (CMOS) memory integrated circuit powered by a voltage supply, the circuit comprising:

n memory array portions, each memory array portion having a plurality of memory cell capacitors for storing data;

control circuitry generating a staged sequence of n memory array powerup control signals upon commencement of powerup of the CMOS memory integrated circuit, each of the n memory array powerup signals being separated from the other by a predetermined time delay interval sufficient to allow transient load effects on the voltage supply from a memory array portion to be eliminated before the voltage supply is connected to the next memory array portion; and n switches, each of which is responsive to a corresponding one of the n control signals for coupling the voltage supply to the memory array portion corresponding to that switch when the corresponding memory array powerup signal is active for causing each memory array portion to be activated separate from other memory array portions.

29. A complementary metal-oxide semiconductor (CMOS) memory integrated circuit powered by a voltage supply, the circuit comprising:

n memory array portions, each memory array portion having a plurality of memory cell capacitors for storing data and wherein the total array portion capacitance relative to a substrate of the CMOS integrated circuit of the memory cell capacitors of each of the n memory array portions is sufficiently low to substantially prevent a substrate voltage from coupling up towards the voltage of the voltage supply to a point which could trigger CMOS latchup in the CMOS memory integrated circuit during the power up of any of the n memory array portions;

control circuitry generating a staged sequence of n memory array powerup control signals upon commencement of powerup of the CMOS memory integrated circuit, each of the n memory array powerup signals being separated from the other by a predetermined time delay interval sufficient to allow transient load effects on the voltage supply from a memory array portion to be eliminated before the voltage supply is connected to the next memory array portion; and n switches, each of which is responsive to a corresponding one of the n control signals for coupling the voltage supply to the memory array portion corresponding to that switch when the corresponding memory array powerup signal is active for causing each memory array portion to be activated separate from other memory array portions.

30. A complementary metal-oxide semiconductor (CMOS) memory integrated circuit powered by a supply voltage, the circuit comprising:

n memory array portions including a first memory array portion and n−1 additional memory array portions, each memory array portion including a capacitor bank having plurality of memory cell capacitors for storing data;

control circuitry for generating an initial powerup control signal when the supply voltage is first applied to the CMOS memory integrated circuit, and for generating n−1 further powerup control signals, each of which becomes active following a selected time delay from the preceding powerup control signal becoming active;

a first switch responsive to the first powerup control signal to couple the supply voltage to the first memory array portion when the first powerup control signal is active to cause the first memory array portion to be activated; and a plurality of n−1 additional switches, each of which is responsive to one of the further powerup control signals for coupling the supply voltage to each of the n memory array portions when its corresponding powerup control signal becomes active, causing each of the n−1 memory array portions to be activated in a staged manner.

31. A complementary metal-oxide semiconductor (CMOS) memory integrated circuit powered by a supply voltage, the circuit comprising:

n memory array portions including a first memory array portion and n−1 additional memory array portions, each memory array portion including a capacitor bank having plurality of memory cell capacitors for storing data;

control circuitry for generating an initial powerup control signal when the supply voltage is first applied to the CMOS memory integrated circuit, and for generating n−1 further powerup control signals, each of which becomes active following a selected time delay from the preceding powerup control signal becoming active;

a first switch responsive to the first powerup control signal to couple the supply voltage to the first memory array portion when the first powerup control signal is active to cause the first memory array portion to be activated; and a plurality of n−1 additional switches, each of which is responsive to one of the further powerup control signals for coupling the supply voltage to each of the n memory array portions when its corresponding powerup control signal becomes active, causing each of the n−1 memory array portions to be activated in a staged manner.

32. A complementary metal-oxide semiconductor (CMOS) memory integrated circuit powered by a supply voltage, the circuit comprising:

a Vbb voltage pump circuit supplies a substrate voltage for the CMOS integrated circuit;

n memory array portions including a first memory array portion and n−1 additional memory array portions, each memory array portion including a capacitor bank having plurality of memory cell capacitors for storing data;

control circuitry for generating an initial powerup control signal when the supply voltage is first applied to the CMOS memory integrated circuit, and for generating n−1 further powerup control signals, each of which becomes active following a selected time delay from the preceding powerup control signal becoming active wherein the selected time delay represents a sufficient time for the Vbb voltage pump circuit to substantially prevent CMOS latchup in the CMOS memory integrated circuit during the powerup of the CMOS integrated circuit;

a first switch responsive to the first powerup control signal to couple the supply voltage to the first memory array portion when the first powerup control signal is active to cause the first memory array portion to be activated; and a plurality of n−1 additional switches, each of which is responsive to one of the further powerup control signals for coupling the supply voltage to each of the n memory array portions when its corresponding powerup control signal becomes active, causing each of the n−1 memory array portions to be activated in a staged manner.

33. A complementary metal-oxide semiconductor (CMOS) memory integrated circuit powered by a supply voltage, the circuit comprising:

n memory array portions including a first memory array portion and n−1 additional memory array portions, each memory array portion including a capacitor bank having plurality of memory cell capacitors for storing data and having a total capacitance relative to the substrate of the CMOS memory integrated circuit of the bank of memory cell capacitors of any one of the n memory array portions is sufficiently low so as to substantially prevent a substrate voltage from coupling up towards the supply voltage to a point which could trigger CMOS latchup in the CMOS memory integrated circuit during the powerup of each of the n memory array portions;

control circuitry for generating an initial powerup control signal when the supply voltage is first applied to the CMOS memory integrated circuit, and for generating n−1 further powerup control signals, each of which becomes active following a selected time delay from the preceding powerup control signal becoming active;

a first switch responsive to the first powerup control signal to couple the supply voltage to the first memory array portion when the first powerup control signal is active to cause the first memory array portion to be activated; and a plurality of n−1 additional switches, each of which is responsive to one of the further powerup control signals for coupling the supply voltage to each of the n memory array portions when its corresponding powerup control signal becomes active, causing each of the n−1 memory array portions to be activated in a staged manner.

* * * * *